(12) United States Patent
Chuang et al.

(10) Patent No.: US 11,909,175 B2
(45) Date of Patent: Feb. 20, 2024

(54) HORIZONTAL CAVITY SURFACE-EMITTING LASER (HCSEL) MONOLITHICALLY INTEGRATED WITH A PHOTODETECTOR

(71) Applicant: Apple Inc., Cupertino, CA (US)

(72) Inventors: Chih-Wei Chuang, Albany, CA (US); Peter L. Chang, San Jose, CA (US); Tong Chen, Fremont, CA (US)

(73) Assignee: Apple Inc., Cupertino, CA (US)

( * ) Notice: Subject to any disclaimer, the term of this patent is extended or adjusted under 35 U.S.C. 154(b) by 90 days.

(21) Appl. No.: 17/148,408

(22) Filed: Jan. 13, 2021

(65) Prior Publication Data
US 2022/0224077 A1    Jul. 14, 2022

(51) Int. Cl.
*H01S 5/18* (2021.01)
*H01S 5/187* (2006.01)
(Continued)

(52) U.S. Cl.
CPC .............. *H01S 5/187* (2013.01); *H01S 5/028* (2013.01); *H01S 5/0262* (2013.01);
(Continued)

(58) Field of Classification Search
CPC ........ H01S 5/185; H01S 5/187; H01S 5/0262; H01S 5/0264; H01S 5/028–0288; H01S 5/18
See application file for complete search history.

(56) References Cited

U.S. PATENT DOCUMENTS 4,794,609 A * 12/1988 Hara ...................... H01S 5/4031
372/50.21
5,588,017 A * 12/1996 Groten ................. G02B 6/4246
372/49.01
(Continued)

FOREIGN PATENT DOCUMENTS

DE    102005052772 B4 *  11/2008  ........... H01S 5/0264
EP         2043210            4/2009
(Continued)

OTHER PUBLICATIONS

Behfar, et al., Horizontal Cavity Surface-Emitting Laser (HCSEL) Devices, *Vertical-Cavity Surface-Emitting Lasers IX*, edited by Lei et al., Proceedings of SPIE, vol. 5737, SPIE, Bellingham, Washington, 2005, pp. 62-68.
(Continued)

*Primary Examiner* — Tod T Van Roy
(74) *Attorney, Agent, or Firm* — Brownstein Hyatt Farber Schreck, LLP

(57) ABSTRACT

An optoelectronic device includes an off-cut III-V semiconductor substrate, a set of epitaxial layers formed on the off-cut III-V semiconductor substrate, and a horizontal cavity surface-emitting laser (HCSEL) having a laser resonant cavity formed in the set of epitaxial layers. The same or another optoelectronic device includes a semiconductor substrate; a laser, epitaxially grown on the semiconductor substrate and having a laser resonant cavity; a semiconductor device, epitaxially grown on the semiconductor substrate and separated from the laser by a single trench having a first vertical wall abutting the laser and a second vertical wall abutting the semiconductor device; and at least one coating on at least one of the first vertical wall or the second vertical wall. The laser resonant cavity of the laser has a horizontal portion parallel to the semiconductor substrate, and each of
(Continued)

the first vertical wall and the second vertical wall is oriented perpendicular to the semiconductor substrate.

21 Claims, 15 Drawing Sheets

(51) Int. Cl.
  *H01S 5/026* (2006.01)
  *H01S 5/028* (2006.01)
  *H01S 5/32* (2006.01)
(52) U.S. Cl.
  CPC .............. *H01S 5/0264* (2013.01); *H01S 5/18* (2013.01); *H01S 5/3202* (2013.01); *H01S 5/0287* (2013.01)

(56) References Cited

U.S. PATENT DOCUMENTS

| | | | | |
|---|---|---|---|---|
| 6,226,309 | B1* | 5/2001 | Tsubota | H01S 5/028 372/49.01 |
| 6,347,103 | B1* | 2/2002 | Song | H01S 5/4087 372/99 |
| 6,611,544 | B1* | 8/2003 | Jiang | H01S 5/18 372/50.1 |
| 6,888,869 | B2* | 5/2005 | Aoki | H01S 5/22 372/46.01 |
| 7,502,403 | B2 | 3/2009 | Shinoda et al. | |
| 8,419,956 | B2* | 4/2013 | Behfar | H01S 5/18 372/45.01 |
| 8,855,160 | B2 | 10/2014 | Adachi et al. | |
| 9,601,903 | B2* | 3/2017 | Adachi | H01S 5/0267 |
| 10,657,994 | B1 | 5/2020 | Hipwell et al. | |
| 10,670,816 | B2* | 6/2020 | Jou | G02B 6/12011 |
| 11,146,745 | B2* | 10/2021 | Siala | G01S 17/89 |
| 11,394,175 | B2* | 7/2022 | Ghosh | H01S 5/02257 |
| 2005/0083982 | A1* | 4/2005 | Behfar | H01S 5/0264 372/50.1 |
| 2005/0123016 | A1* | 6/2005 | Behfar | H01S 5/125 372/50.1 |
| 2005/0147145 | A1* | 7/2005 | Behfar | H01S 5/0625 372/64 |
| 2005/0157770 | A1* | 7/2005 | Behfar | H01S 5/18 372/50.1 |
| 2005/0180482 | A1 | 8/2005 | Osowski et al. | |
| 2006/0118893 | A1* | 6/2006 | Behfar | H01S 5/0262 257/E31.022 |
| 2006/0270077 | A1* | 11/2006 | Behfar | H01S 5/0264 438/24 |
| 2008/0198890 | A1 | 8/2008 | Ungar et al. | |
| 2008/0212973 | A1* | 9/2008 | Song | G02B 6/4246 398/139 |
| 2010/0111126 | A1* | 5/2010 | Shimizu | H01S 5/18 372/45.01 |
| 2010/0316076 | A1* | 12/2010 | Behfar | H01S 5/18 372/45.01 |
| 2012/0077294 | A1* | 3/2012 | Behfar | H01S 5/18 438/31 |
| 2012/0183009 | A1 | 7/2012 | Adachi et al. | |
| 2012/0327965 | A1* | 12/2012 | Shinoda | H01S 5/125 372/45.01 |
| 2017/0179682 | A1* | 6/2017 | Ishii | A61B 5/0261 |
| 2022/0224077 | A1* | 7/2022 | Chuang | H01S 5/0262 |

FOREIGN PATENT DOCUMENTS

| | | | | |
|---|---|---|---|---|
| JP | 08195532 | A | * 7/1996 | |
| JP | H10125989 | A | * 5/1998 | |
| JP | 2010003883 | A | * 1/2010 | |
| JP | 2010226056 | A | * 10/2010 | ............. H01S 5/028 |
| KR | 20100039839 | | 4/2010 | |
| KR | 20100039839 | A | * 4/2010 | |
| WO | WO-2005072224 | A2 | * 8/2005 | ........... H01S 5/0262 |
| WO | WO-2022012988 | A1 | * 1/2022 | |

OTHER PUBLICATIONS

Billah, et al., "Hybrid integration of silicon photonics circuits and InP lasers by photonic wire bonding," *Optica*, vol. 5, No. 7, Jul. 2018, pp. 876-883.

Eichler, et al., *Springer Series in Optical Sciences*, vol. 220, Chapter: Lasers, Basics, Advances and Applications, Springer Nature Switzerland AG, 2018, pp. 175-176.

Invitation to Pay Additional Fees dated May 10, 2022, PCT/US2022/011831, 11 pages.

International Search Report and Written Opinion dated Aug. 2, 2022, PCT/US2022/011831, 22 pages.

Green, et al., "Horizontal Cavity Vertically Emitting Lasers with Integrated Monitor Photodiodes," Algorithms and Technologies for Multispectral, Hyperspectral, and Ultraspectral Imagery XIX, Proceedings of SPIE, vol. 6352, Sep. 22, 2006, 8 pages.

* cited by examiner

HORIZONTAL CAVITY SURFACE-EMITTING LASER (HCSEL) MONOLITHICALLY INTEGRATED WITH A PHOTODETECTOR

FIELD

The described embodiments relate generally to lasers and photodetectors. More particularly, the described embodiments relate to HCSELs, and to HCSELs or edge-emitting lasers (EELs) monolithically integrated with photodiodes.

BACKGROUND

There are two common types of semiconductor lasers, horizontal cavity edge-emitting lasers (EELs) and vertical-cavity surface-emitting lasers (VCSELs).

An EEL has its laser resonant cavity in plane with the epitaxial layers of the EEL so that light resonates horizontally and outputs horizontally (i.e., from an edge of the device). The length of the horizontal laser resonant cavity can be designed quite flexibly without restrictions. Generally, a longer cavity is needed for higher output power. Therefore, EELs with longer laser resonant cavities are suitable for applications requiring a high-power, spatially coherent light source. One such application example is a mid- to long-range, frequency- or phase-modulated light detection and ranging (LIDAR) system.

A disadvantage of EELs is that they cannot be tested at the epi/wafer level prior to die singulation, or without forming a non-trivial in-wafer test structure. Moreover, when mounting an EEL chip onto a circuit board, the horizontal light emission direction is not universally preferred and sometimes requires the use of an external 90° light-folding mirror to bend the laser's output beam to a vertical direction. The external 90° light-folding mirror may be used, for example, when fitting an EEL into a flat aspect-ratio device such as a hand-held device (e.g., a smart phone or a tablet computer) and requiring the laser beam to leave the device perpendicularly to one of the device's major surfaces (e.g., perpendicularly to the device's display).

VCSELs, on the other hand, have a light emission direction perpendicular to a chip surface, making them suitable for certain applications. The surface emission property also makes high-throughput wafer-level laser characterization (test) possible. However, since the light resonant direction of a VCSEL is perpendicular to the epitaxial layers of the VCSEL, the length of a VCSEL's laser resonant cavity is usually limited to the feasible epitaxial layer thickness and growth time, device heat dissipation, and operating voltage considerations. As a consequence, a single VCSEL has limited output power. VCSEL arrays can be used to boost the total output power, but the individual VCSELs of the array do not lase coherently. As a result, the array's aggregate light may have a higher power, but does not offer spatial coherence. VCSEL arrays are therefore more suitable for, e.g., near- to mid-range, intensity-modulated applications such as time-of-flight LIDAR systems.

As opposed to EELs, VCSELs can be tested at epi/wafer level at significantly higher throughput and lower cost.

SUMMARY

A hybrid type of device referred to as horizontal cavity surface-emitting laser (HCSEL) may combine the advantages of an EEL and a VCSEL, offering spatially coherence, fixed beam polarization, and high brightness/output power while still preserving the vertical emission property. One of the challenges to creating a HCSEL is the formation of a turning mirror inside the device—i.e., the formation of a mirror that reflects light propagating within a horizontal portion of the device's laser resonant cavity into a (typically smaller) vertical portion of the device's laser resonant cavity, and vice versa. Techniques for forming such a turning mirror are therefore described herein.

A HCSEL also preserves another EEL property, which is the provision of two emission ports (or two output facets). The HCSEL's "front side" output is the HCSEL's main power output and provides a vertical output beam. The HCSEL's "back side" output is typically fainter and provides a horizontal output beam. As described herein, a photodetector (e.g., a photodiode) can be monolithically integrated with the HCSEL using the same set of epitaxial layers, or by growing a separate set of epitaxial layers on the same substrate, and can be used as a laser power monitor. Described herein are new ways to coupling the HCSEL's back side output into the photodetector.

Similar to a VCSEL, a HCSEL can be readily tested at the epi/wafer level. The integration of a photodetector (PD) into a HCSEL enables compact and high fidelity laser power monitoring, for functionality and applications including laser safety, close loop power control, self-mixing interferometry (SMI), and so on.

In a system requiring a high-power output and a spatially coherent surface emission, a HCSEL monolithically integrated with a PD can reduce the component/assembly costs and module complexity, enhance assembly tolerances, improve module functionality, and/or improve laser performance and reliability.

Embodiments of the systems, devices, methods, and apparatus described in the present disclosure are directed to such integrated HCSELs and PDs. Some of the described embodiments and techniques also relate to EEL and PD integration, or to the formation of HCSELs regardless of whether they are integrated with a PD.

In a first aspect, the present disclosure describes an optoelectronic device. The optoelectronic device may include an off-cut III-V semiconductor substrate, a set of epitaxial layers formed on the off-cut III-V semiconductor substrate, and a HCSEL having a laser resonant cavity formed in the set of epitaxial layers.

In another aspect, the present disclosure describes another optoelectronic device. The optoelectronic device may include a semiconductor substrate; a laser, epitaxially grown on the semiconductor substrate and having a laser resonant cavity; a semiconductor device, epitaxially grown on the semiconductor substrate and separated from the laser by a single trench having a first vertical wall abutting the laser and a second vertical wall abutting the semiconductor device; and at least one coating on at least one of the first vertical wall or the second vertical wall. The laser resonant cavity of the laser may have a horizontal portion parallel to the semiconductor substrate, and each of the first vertical wall and the second vertical wall may be oriented perpendicular to the semiconductor substrate.

In still another aspect of the disclosure, the present disclosure describes an electronic device. The electronic device may include a housing; a cover mounted to the housing; a display positioned under the cover and viewable through the cover; and a HCSEL configured to emit short-wave infrared (SWIR) radiation through the display (i.e., the display's active area) and the cover.

In addition to the exemplary aspects and embodiments described above, further aspects and embodiments will become apparent by reference to the drawings and by study of the following description.

BRIEF DESCRIPTION OF THE DRAWINGS

The disclosure will be readily understood by the following detailed description in conjunction with the accompanying drawings, wherein like reference numerals designate like structural elements, and in which.

Figure 1:
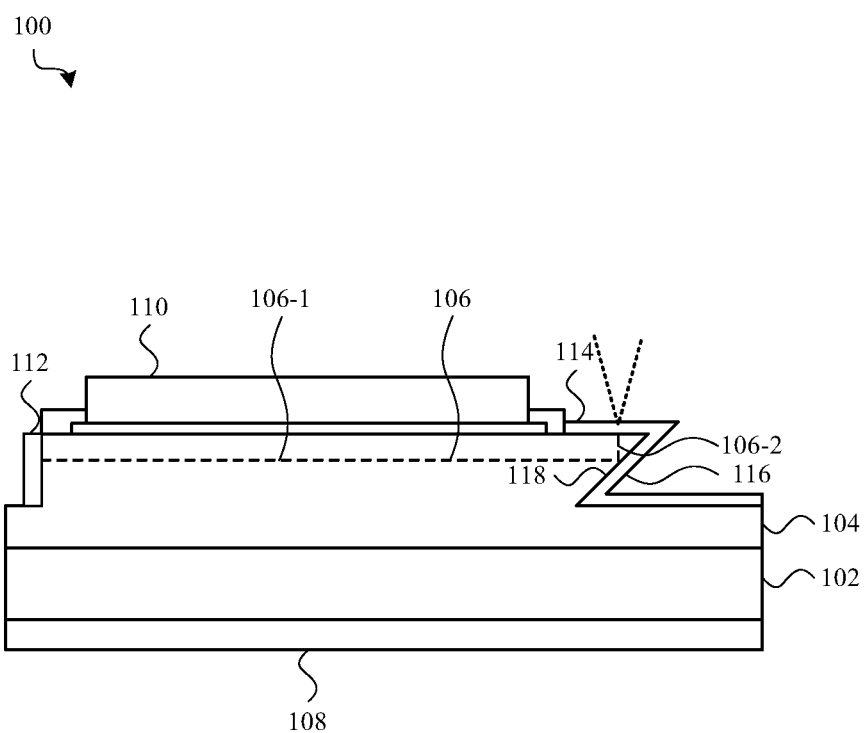
FIG. 1 shows an example of an optoelectronic device.

The use of cross-hatching or shading in the accompanying figures is generally provided to clarify the boundaries between adjacent elements and also to facilitate legibility of the figures. Accordingly, neither the presence nor the absence of cross-hatching or shading conveys or indicates any preference or requirement for particular materials, material properties, element proportions, element dimensions, commonalities of similarly illustrated elements, or any other characteristic, attribute, or property for any element illustrated in the accompanying figures.

Additionally, it should be understood that the proportions and dimensions (either relative or absolute) of the various features and elements (and collections and groupings thereof) and the boundaries, separations, and positional relationships presented therebetween, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

DETAILED DESCRIPTION

Reference will now be made in detail to representative embodiments illustrated in the accompanying drawings. It should be understood that the following description is not intended to limit the embodiments to one preferred embodiment. To the contrary, it is intended to cover alternatives, modifications, and equivalents as can be included within the spirit and scope of the described embodiments as defined by the appended claims.

The following description relates to HCSELs and PDs, including the formation of HCSEL turning mirrors, the integration of HCSEls with PDs, and the integration of EELs with PDs. The optoelectronic devices described herein may provide high coherence, high brightness, out-of-plane coupling, with high-throughput epi/wafer level testing. The optoelectronic devices may also be produced in a simplified way, at low cost, and with high reliability.

To create a Fabry-Perot (FP) type HCSEL having an output facet in plane with the device's epitaxial stack, a 90° turning mirror needs to be formed such that it intersects the horizontal portion of the device's laser resonant cavity. Total internal reflection (TIR) at the turning mirror's surface may then be used to bend light traveling along the horizontal portion of the laser resonant cavity by 45°. Depending on the orientation of the turning mirror, light may be bent away from or toward the HCSEL's substrate. When the turning mirror has a re-entrant, dovetail-like 45° angle, light may be bent away from a HCSEL's substrate. When the turning mirror has a wedge-like, sloped 45° angle, light may be bent toward a HCSEL's substrate. Typically, the turning mirror is formed by a dry etch process. However, techniques for engineering a HCSEL's substrate and epitaxial layers such that the turning mirror may be formed by a wet etch process are described herein.

Also described herein are ways to integrate a PD with a HCSEL or an EEL such that improved power monitoring may be achieved and/or interference with power monitoring may be reduced.

These and other aspects are described with reference to FIGS. 1-12. However, those skilled in the art will readily appreciate that the detailed description given herein with respect to these figures is for explanatory purposes only and should not be construed as limiting.

Directional terminology, such as "top", "bottom", "upper", "lower", "front", "back", "over", "under", "beneath", "left", "right", etc. may be used with reference to the orientation of some of the components in some of the figures described below. Because components in various embodiments can be positioned in a number of different orientations, directional terminology is used for purposes of illustration only and is in no way limiting. The directional terminology is intended to be construed broadly, and therefore should not be interpreted to preclude components being oriented in different ways. The use of alternative terminology, such as "or", is intended to indicate different combinations of the alternative elements. For example, A or B is intended to include, A, or B, or A and B.

FIG. 1 shows an example of an optoelectronic device. By way of example, the optoelectronic device is a HCSEL 100 (a type of laser), but other optoelectronic devices may be formed using some of the construction principles described herein.

The HCSEL 100 may include a semiconductor substrate 102. A set of epitaxial layers 104 may be formed (i.e., epitaxially grown) on the semiconductor substrate 102. A laser resonant cavity 106 may be formed in the set of epitaxial layers 104. The laser resonant cavity 106 may include a horizontal portion 106-1 and a vertical portion 106-2. Together, the horizontal and vertical portions 106-1, 106-2 form an L-shaped laser resonant cavity 106. First and second electrodes 108, 110 may be formed on different sides of the laser resonant cavity 106. For example, a first electrode 108 may be formed on a surface of the semiconductor substrate 102 opposite a surface of the semiconductor substrate 102 on which the set of epitaxial layers 104 is formed, and a second electrode 110 may be formed on the set of epitaxial layers 104 such that the semiconductor substrate 102 and set of epitaxial layers 104 are positioned substantially between the first and second electrodes 108, 110.

As used herein, "horizontal" structures extend parallel to a semiconductor substrate, and light that propagates in a horizontal direction (or from an "edge") propagates parallel to a semiconductor substrate. "Vertical" structures extend perpendicular to a semiconductor substrate, and light that propagates in a vertical direction (or from a "surface") propagates perpendicular to a semiconductor substrate. "Surfaces" of structures generally extend parallel to a semiconductor substrate. "Edges" of structures generally extend perpendicular or non-perpendicularly to (but not parallel to) a semiconductor substrate.

A first reflective structure 112 may be oriented perpendicular to the semiconductor substrate 102 and bound a first end of the horizontal portion 106-1 of the laser resonant cavity 106. A second reflective structure 114 may be oriented parallel to the semiconductor substrate 102 and bound a first end of the vertical portion 106-2 of the laser resonant cavity 106. In some cases, the first reflective structure 112 and the second reflective structure 114 may be partially transmissive and partially reflective. A third reflective structure 116 may be oriented at a non-perpendicular angle with respect to an upper surface of the semiconductor substrate 102 (or with respect to the horizontal portion 106-1 of the laser resonant cavity 106) and may define a transition between the horizontal portion 106-1 of the laser resonant cavity 106 and the vertical portion 106-2 of the laser resonant cavity 106. The non-perpendicular angle at which the third reflective structure 116 is oriented with respect to the upper surface of the semiconductor substrate 102 (or with respect to the horizontal portion 106-1 of the laser resonant cavity 106) may in some cases by a 45° angle+/−5°.

Each of the first, second, and third reflective structures 112, 114, 116 may include one or more coatings applied to a surface or edge of the set of epitaxial layers 104. In some cases, the same one or more coatings may be applied to (i.e., deposited on) the set of epitaxial layers to form each of the reflective structures 112, 114, 116. Each coating may be, for example, a dielectric coating, a metallic coating, a semiconductor coating, or a 2D or 3D photonic coating. In some embodiments, one or more of the reflective structures 112, 114, 116 may also or alternatively include an attached component. In some embodiments, one or more of the reflective structures 112, 114, 116 may be formed by means of a treatment (e.g., a polishing, roughening, etching, and or other treatment). In some embodiments, one or both of the reflective structures 112, 114 may be formed by a material-to-air (or material-to-other gas) interface.

To achieve the non-perpendicular angle of the third reflective structure 116, one or more epitaxial layers in the set of epitaxial layers 104 may wet-etched or otherwise processed. The surface 118 may itself be reflective to light that propagates in a horizontal direction or a vertical direction within the laser resonant cavity 106, and the surface 118 may be (or be part of) the reflective structure 116 (e.g., total internal reflection may occur at the angled boundary between the set of epitaxial layers 204 (n≥2.3) and air (n=1; or other overfill with n≤1.6). In some embodiments, coatings applied to the surface 118, treatments of the surface 118, or components attached to the surface 118 may provide the reflective structure 116 and/or cooperate with the surface 118 to provide the reflective structure 116.

Depending on the materials used to form the semiconductor substrate 102 and set of epitaxial layers 104, it can be difficult to remove portions of one or more of the epitaxial layers at an angle of 45°+/−5° to form the surface 118. To better enable the one or more epitaxial layers to be removed at a somewhat uniform (e.g., planar) non-perpendicular angle, at 45°+/−5°, the semiconductor substrate 102 may be selected as an off-cut III-V semiconductor substrate (with n≥2.3). In addition, and in some cases, the set of epitaxial layers 104 may also be off-cut. For example, a set of indium gallium arsenide (InGaAs) or indium gallium arsenide phosphide (InGaAsP) epitaxial layers 104 may have an off-cut of 9.7°+/−5° from a (100) surface of an indium phosphide (InP) semiconductor substrate 102 (i.e., the non-off-cut (111) etch stop planes may be originally angled at 54.7°). A set of epitaxial layers 104 formed in this manner, on an off-cut III-V semiconductor substrate, may be partially removed at an angle of 45°+/−5°, with a surface roughness less than 100 nanometers (nm) (and preferably less than 70 nm, or even less than 50 nm).

In operation, the first and second electrodes 108, 110 may be used to apply a voltage or current to the laser resonant cavity 106. Applying a voltage establishes an electrical field between the first and second electrodes 108, 110, which results in carrier population inversion across the bandgap of the laser gain medium and stimulates coherent photon generation. As the light moves horizontally, it reflects off of the first reflective structure 112 toward the third reflective structure 116, or off the third reflective structure 116 toward the second reflective structure 114. Light that reflects off of the third reflective structure 116 toward the second reflective structure 114 may be reflected back toward the third reflective structure 116, and from the third reflective structure 116 toward the first reflective structure 112. A certain portion of the light reflected from the third reflective structure 116 toward the second reflective structure 114 (e.g., 50% or less) may pass through the second reflective structure 114 (e.g., through an aperture in the second reflective structure 114) and be emitted as an optical output of the HCSEL 100. A portion of the emitted light may also be scattered and/or back-reflected and received back into the HCSEL 100 through the second reflective structure 114, and may mix (i.e., self-mix) with the light generated as a result of lasing. Characteristics of the self-mixing can be detected by sensing changes in an electrical signal (e.g., a voltage or current) at the first or second electrode 108, 110, and can be used to determine properties of an object or particle off which light emitted by the HCSEL 100 reflects external to the HCSEL 100. Such properties may include the position, speed, texture, and so on of the object or particle. Additionally or alternatively to detecting the self-mixing by monitoring an electrical signal produced at the first or second electrode 108, 110, a relatively small portion of the light reflected from the third reflective structure 116 toward the first reflective structure 112 may be allowed to pass through the first reflective structure 112 and be sensed by a photodetector adjacent the first reflective structure 112. In this manner, an electrical signal generated by the photodetector may be used to determine characteristics of the self-mixing that occurs within the laser resonant cavity 106, as well as properties of an object or particle external to the HCSEL 100. Such a photodetector is not shown in FIG. 1 but is shown in each of FIGS. 3-9.

Figure 2:
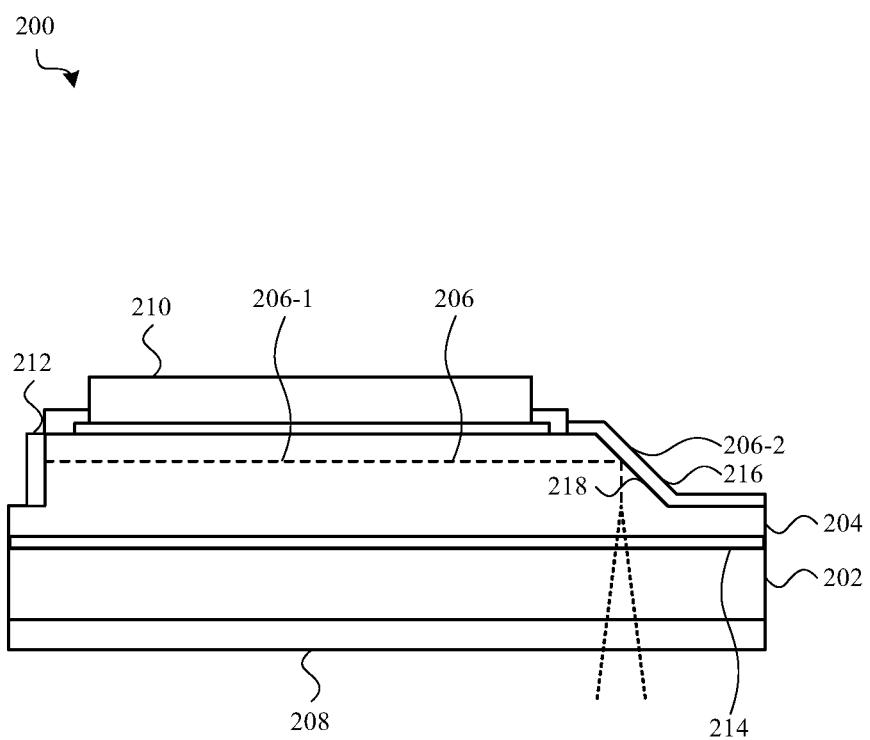
FIG. 2 shows another example of an optoelectronic device.

FIG. 2 shows another example of an optoelectronic device. By way of example, the optoelectronic device is a HCSEL 200. However, in contrast to the HCSEL described with reference to FIG. 1, which emits light away from the HCSEL's semiconductor substrate (i.e., the HCSEL makes a primary light emission away from the HCSEL's semiconductor substrate), the HCSEL 200 emits light toward and through the HCSEL's semiconductor substrate 202 (i.e., the HCSEL 200 makes a primary light emission through the semiconductor substrate 202).

Similarly to the HCSEL described with reference to FIG. 1, the HCSEL 200 may include a semiconductor substrate 202; a set of epitaxial layers 204 formed on the semiconductor substrate 202; a laser resonant cavity 206 formed in the set of epitaxial layers 204; first and second electrodes 208, 210; and first, second, and third reflective structures 212, 214, 216. However, in contrast to the HCSEL described with reference to FIG. 1, the HCSEL 200 has a third reflective structure 216 that reflects light received from the horizontal portion 206-1 of the laser resonant cavity 206 into the vertical portion 206-2 of the laser resonant cavity 206, and particularly through the second reflective structure 214, due to a less than 100% reflectivity of the second reflective structure 214, and through the semiconductor substrate 202. Of note, the second reflective structure 214 may be buried in the set of epitaxial layers 204.

To achieve the non-perpendicular angle of the third reflective structure 216, one or more epitaxial layers in the set of epitaxial layers 204 may be etched at an angle (e.g., dry etched or wet etched). The surface 218 may itself be reflective to light that propagates in a horizontal direction or a vertical direction within the laser resonant cavity 206 (e.g., total internal reflection may occur at the angled boundary between the set of epitaxial layers 204 (n≥2.3) and air (n=1), and the surface 218 may be (or be part of) the reflective structure 216. In some embodiments, coatings (e.g., dielectric, metallic, semiconductor, and/or 2D/3D photonic coatings) applied to the surface 218, treatments of the surface 218, or components attached to the surface 218 may provide the reflective structure 216 and/or cooperate with the surface 218 to provide the reflective structure 216.

As discussed with reference to FIG. 1, depending on the materials used to form the semiconductor substrate 202 and set of epitaxial layers 204, it can be difficult to remove portions of one or more of the epitaxial layers at an angle of 45°+/−5° to form the surface 218. To better enable the one or more epitaxial layers to be removed at a somewhat uniform (e.g., planar) non-perpendicular angle, at 45°+/−5°, the semiconductor substrate 202 may be selected as an off-cut III-V semiconductor substrate (with n≥2.3). In addition, and in some cases, the set of epitaxial layers 204 may also be off-cut. For example, a set of InGaAs or InGaAsP epitaxial layers 204 may have an off-cut of 9.7°+/−5° from a (100) surface of an InP semiconductor substrate 202 (i.e., the non-off-cut (111) etch stop planes may be originally angled at 54.7°). A set of epitaxial layers 204 formed in this manner, on an off-cut III-V semiconductor substrate, may be partially removed at an angle of 45°+/−5°, with a surface roughness less than 100 nanometers (nm) (and preferably less than 70 nm, or even less than 50 nm).

Figure 3:
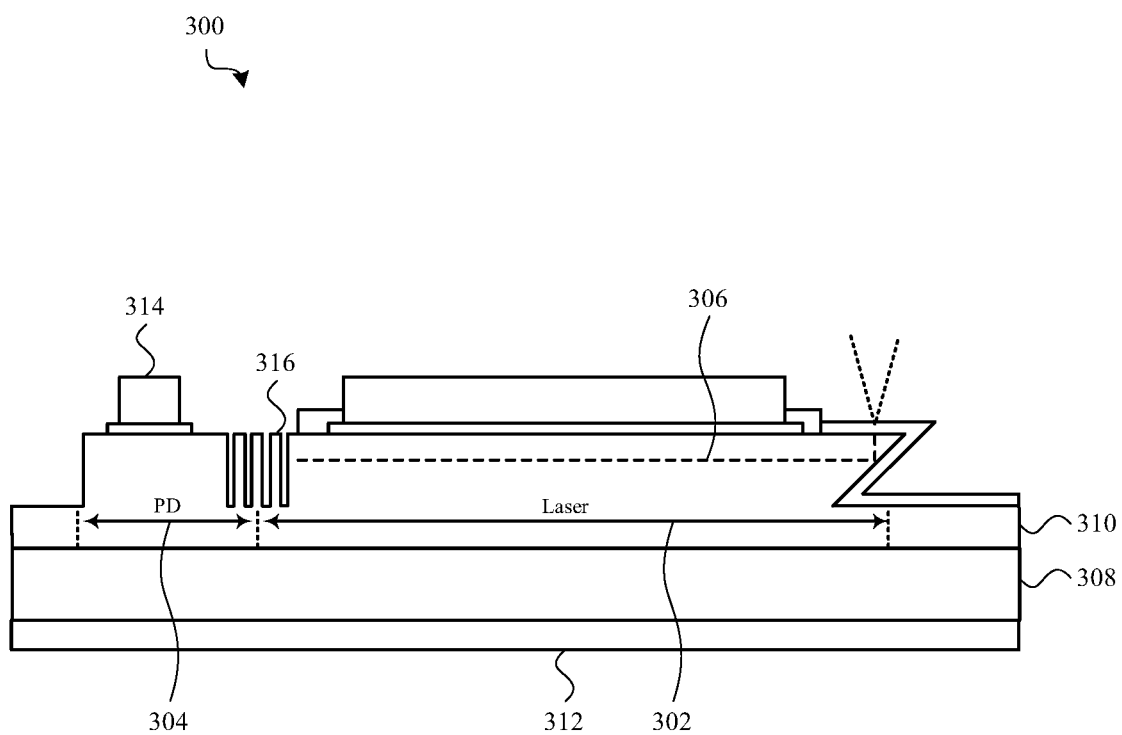
FIG. 3 shows an example of an optoelectronic device including a laser and another semiconductor device (e.g., a photodetector)

FIG. 3 shows an example of an optoelectronic device 300 including a laser 302 and another semiconductor device (e.g., a photodetector 304), monolithically integrated on a semiconductor substrate 308. At least a portion of the laser's laser resonant cavity 306 may extend in a horizontal direction. In some embodiments, the laser 302 may be a HCSEL, such as the HCSEL described with reference to FIG. 1 or 2 or any other HCSEL described herein. In other embodiments, the laser 302 may be an EEL.

The laser 302 and the photodetector 304 may share a semiconductor substrate 308 and set of epitaxial layers 310, with the set of epitaxial layers 310 being formed (e.g., epitaxially grown) on the semiconductor substrate 308. In some cases, the photodetector 304 may share a first electrode 312 with the laser 302 and have a dedicated second electrode 314. The first electrode 312 may be formed on a surface of the semiconductor substrate 308 opposite a surface of the semiconductor substrate 308 on which the set of epitaxial layers 310 is formed, and the second electrode 314 may be formed on the set of epitaxial layers 310 such that the semiconductor substrate 308 and set of epitaxial layers 310 are positioned substantially between the first and second electrodes 312, 314. In alternate embodiments, the laser 302 and the photodetector 304 may be formed in different sets of epitaxial layers (e.g., adjacent epitaxial stacks formed on the semiconductor substrate).

A set of vertical trenches defining a distributed Bragg reflector (DBR) 316 may be formed (e.g., etched) between the laser 302 and photodetector 304. The DBR 316 may form, for example, the first reflective structure described with reference to FIG. 1 or 2. The horizontal portion of the laser resonant cavity 306 may abut the DBR 316.

A portion of the light that reflects within the laser resonant cavity 306 may pass through the DBR 316 and be sensed by the photodetector 304.

Figure 4:
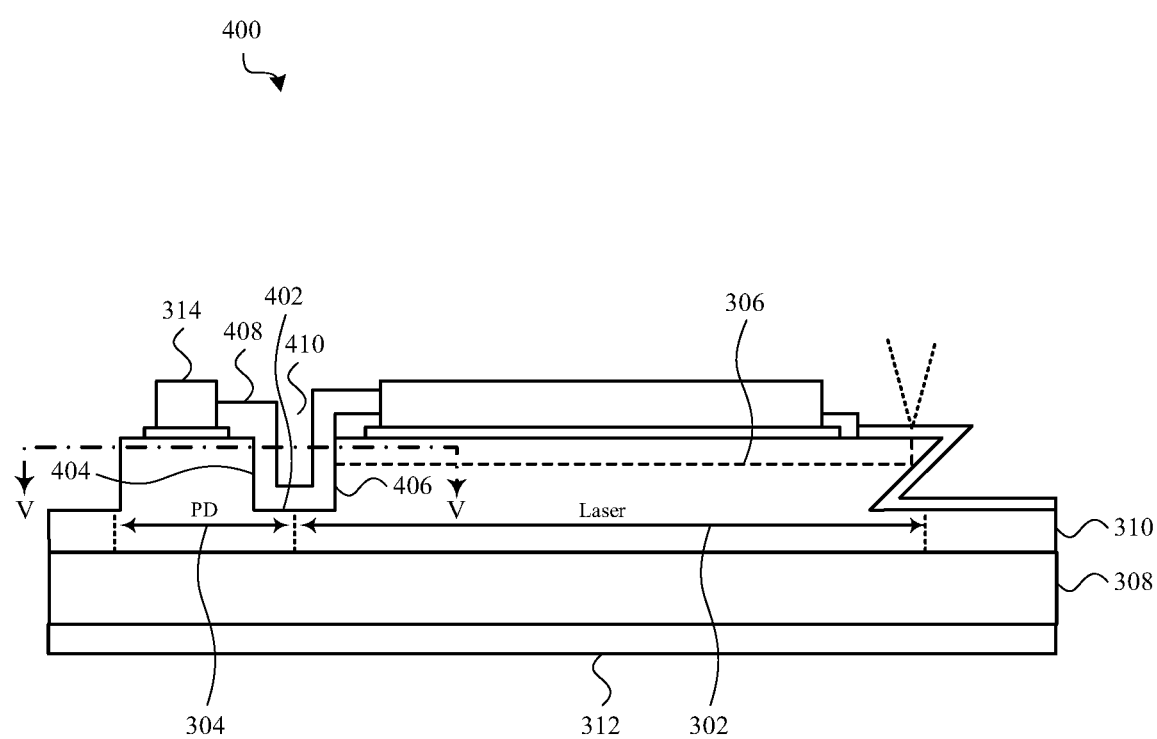
FIG. 4 shows a variation of the optoelectronic device described with reference to FIG. 3, in which the DBR is replaced with a single trench separating the laser and the photodetector.

FIG. 4 shows a variation of the optoelectronic device 300 in which the DBR 316 is replaced with a single trench 402 separating the laser 302 and the photodetector 304. In some cases, the trench 402 may be etched (e.g., dry-etched). In the optoelectronic device 400, the single trench 402 has a first vertical wall 406 abutting the laser 302 and a second vertical wall 404 abutting the photodetector 304. At least one coating 408 (e.g., at least one dielectric, metallic, semiconductor, and/or 2D/3D photonic coating) may be applied to the first vertical wall 406 and/or the second vertical wall 404. The at least one coating 408, sometimes in combination with an optional gap 410, may function as a DBR and/or the first reflective structure described with reference to FIG. 1 or 2.

The trench 402, in combination with the coating(s) 408, may be easier to form than the multiple, finer width trenches described with reference to FIG. 3. Furthermore, the single trench 402 and coating(s) 408 may maximize power coupling. In addition to, or as an alternative to, the trench 402 and coating(s) 408, it is possible to form electrically-isolated vertical barriers via an ion implantation process, though the resulting refractive index change and optical path loss may be less controlled compared to a trench 402 with coating(s) 408.

Figure 5:
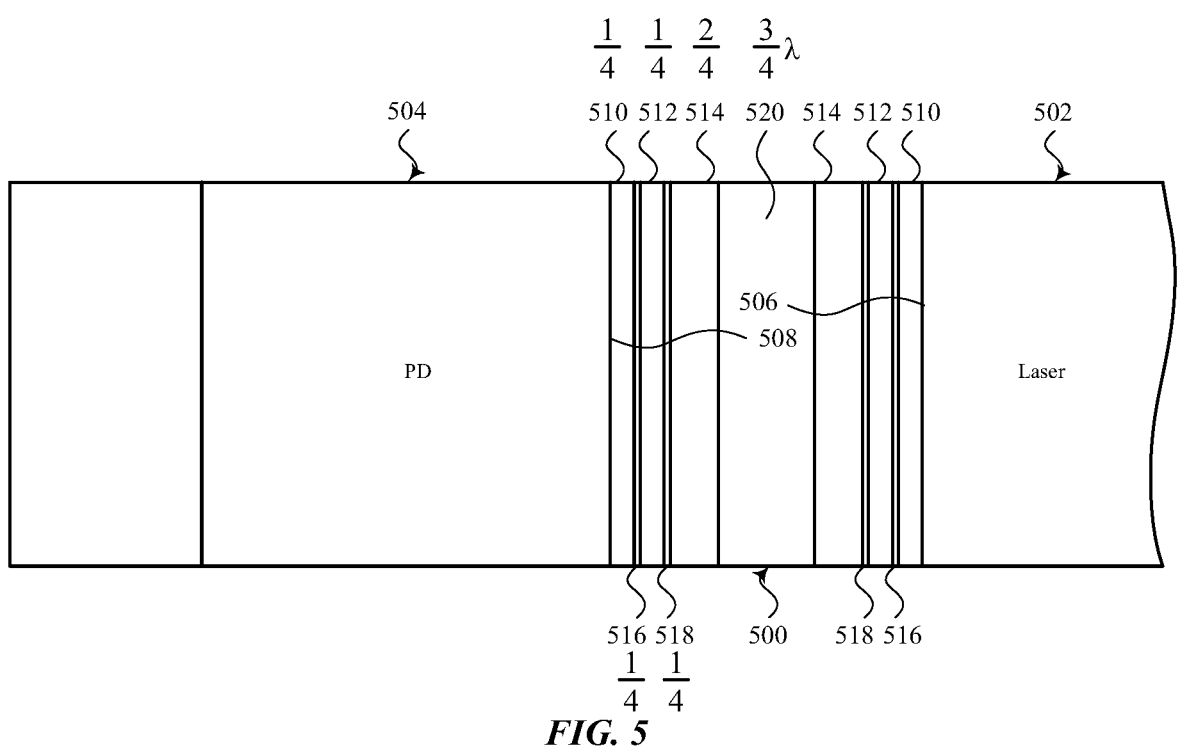
FIGS. 5 and 6 show example embodiments of coatings that may be applied to a first vertical wall and/or a second vertical wall of a trench formed between a laser and a photodetector
Figure 6:
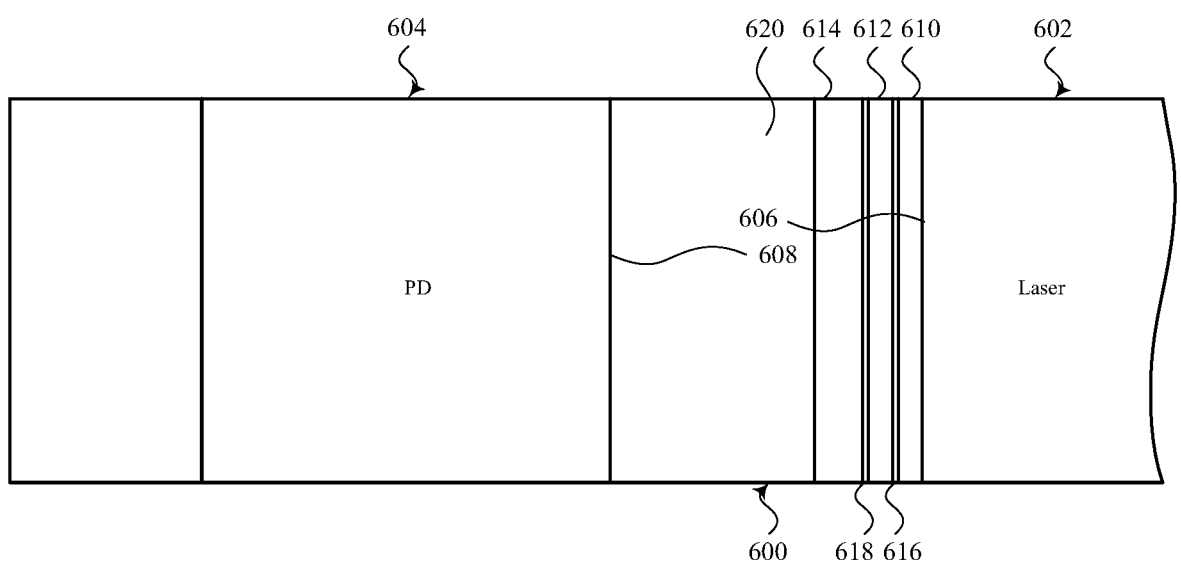

FIGS. 5 and 6 show example embodiments of coatings (e.g., dielectric, metallic, semiconductor, and/or 2D/3D photonic coatings) that may be applied to a first vertical wall and/or a second vertical wall of a trench formed between a laser and a photodetector. FIG. 5 shows a cross-section of symmetrically applied coatings taken from the view of cut-line V-V in FIG. 4. FIG. 6 shows an alternative cross-section of asymmetrically applied coatings.

As shown in FIG. 5, a trench 500 separates a laser 502 and a photodetector 504. The trench 500 has a first vertical wall 506 abutting the laser 502 and a second vertical wall 508 abutting the photodetector 504. At least one coating may be symmetrically applied to the first vertical wall 506 and the second vertical wall 508.

By way of example, the coatings shown in FIG. 5 include first, second, and third coatings 510, 512, 514. Each of the coatings 510, 512, 514 may include aluminum oxide ($Al_2O_3$). Each of the first, second, and third coatings 510, 512, 514 may symmetrically coat both the first vertical wall 506 and the second vertical wall 508. One or more of the first, second, and third coatings 510, 512, 514 may also coat the bottom (or floor) of the trench 500, and in some cases may overlap the top surfaces of the set of epitaxial layers forming the laser 502 and/or the photodetector 504.

The second coating 512 may be separated from the first coating 510 by a first layer of amorphous silicon (a-Si) 516, and the third coating 514 may be separated from the second coating 512 by a second layer of amorphous silicon 518. The first and second coatings 510, 512, in combination with the adjacent layers 516, 518, may define first low-high-index quarter-wavelength DBR pairs abutting the first vertical wall 506, and second low-high-index quarter-wavelength DBR pairs abutting the second vertical wall 508. The third coating 514 may define a half-wavelength low-index layer (or a coating having a thickness that is an integer multiple of a half-wavelength layer). In some cases, additional coatings may be deposited within the trench to define additional DBR pairs (e.g., 1, 2, 3, . . . DBR pairs) between each vertical wall 506, 508 of the trench 500 and the half-wavelength low-index layer defined by the third coating 514.

The above-mentioned quarter-wavelength or half-wavelength layers (or coatings) can each have their thicknesses increased independently by a positive-integer multiple of the half-wavelengths. (e.g., a ¼ wavelength layer can be replaced with a ¼+x/2 wavelength layer, where x is any positive integer. Also, or alternatively, the last ½ wavelength layer can be replaced with a y/2 wavelength layer, where y is any positive integer. The above mentioned air gap or fill material, or the lowest refractive-index-section between the laser 502 and photodetector 504, in the middle of the entire reflective structure, may have a thickness of ¼+z/2 wavelength, where z is any positive integer. Of note, all of the above-mentioned coating thicknesses in wavelengths are defined as the wavelength inside that particular material, and not a free-space wavelength.

The third coating 514 may in some cases bound an air gap 520 disposed within the trench 500. In other cases, the third coating 514 may bound a fill material (e.g., silicon dioxide) disposed within the trench 500. The trench 500 may also include a combination of air and a fill material, or different combinations of fill materials. The coating(s) 510, 512, 514, 516, and 518 applied to the first and second vertical walls 506, 508 of the trench 500, in combination with the air gap 520 or a fill material, may form a dielectric-air-dielectric or dielectric-fill-dielectric HR mirror. The air gap 520 or fill material thickness can be ¼+m/2 wavelengths, where m is any positive integer.

In some embodiments, the air gap 520 or fill material may be absent. In such embodiments, the last layer (e.g., coating 514 in FIG. 5) on the first vertical wall 506 and the last layer (e.g., coating 514 in FIG. 5) on the second vertical wall 508 may coalesce. In such embodiments, the thickness of the coating 514, for example, may be changed to ⅛+k/2 wavelengths, where k is any positive integer.

The thicknesses of the alternating low-reflective-index $Al_2O_3$ coatings and high-reflective-index amorphous Si (a-Si) layers may be carefully designed to make the reflection from every interface in phase, such that a constructive interference can be built to achieve a high reflectivity (e.g., >97%) with a minimum number of layers. Due to the standing wave nature of the reflections, all of the layer thicknesses, including the air gap or fill thickness, can be constructed as shown in FIG. 5, plus any multiple positive integer of λ/2, while still resulting in the same high reflectivity in a plane-wave calculation. For a practical-case calculation and design involving diffraction, which can happen in this coupling due to the lack of wave guiding structures, each layer thickness may be kept as thin as possible to minimize diffraction loss.

In alternative embodiments, different numbers of one or more coatings may be applied to the vertical walls and/or floor of the trench. One or more planarization and/or passivation materials may also be deposited on the vertical walls and/or floor of the trench 500.

As shown in FIG. 6, a trench 600 separates a laser 602 and a photodetector 604. The trench 600 has a first vertical wall 606 abutting the laser 602 and a second vertical wall 608 abutting the photodetector 604. At least one coating (e.g., at least one dielectric, metallic, semiconductor, and/or 2D/3D photonic coating) may be applied to the first vertical wall 606.

By way of example, the coatings shown in FIG. 6 include first, second, and third coatings 610, 612, 614. Each of the coatings 610, 612, 614 may include aluminum oxide. Each of the first, second, and third coatings 610, 612, 614 may coat the first vertical wall 606 or the second vertical wall 608. By way of example, the first, second, and third coatings 610, 612, 614 are only applied to the first vertical wall 606. In other embodiments, the first, second, and third coatings 610, 612, 614 may alternatively be applied only to the second vertical wall 608. In other asymmetric applications, one or more of the coatings may be applied to the first vertical wall 606, and one or more other coatings may be applied to the second vertical wall 608; or, one or more coatings may be applied only to the first vertical wall 606 or the second vertical wall 608, and one or more other coatings may be applied to both the first vertical wall 606 and the second vertical wall 608. One or more of the first, second, and third coatings 610, 612, 614 may also coat the bottom (or floor) of the trench 600, and in some cases may overlap the top surfaces of the set of epitaxial layers forming the laser 602 and/or the photodetector 604.

The second coating 612 may be separated from the first coating 610 by a first layer of amorphous silicon 616, and the third coating 614 may be separated from the second coating 612 by a second layer of amorphous silicon 618. The first coating 610, in combination with the adjacent layer 616, may define a first quarter-wavelength DBR. The second coating 612, in combination with the adjacent layer 618, may define a second quarter-wavelength DBR. The third coating 614 may define a half-wavelength DBR.

The third coating 614 may in some cases bound an air gap 620 disposed within the trench 600. In other cases, the third coating 614 may bound a fill material (e.g., silicon dioxide) disposed within the trench 600. The trench 600 may also include a combination of air and a fill material, or different combinations of fill materials.

In alternative embodiments, different numbers of one or more coatings may be applied to one or both of the vertical walls and/or floor of the trench.

Figure 7A:
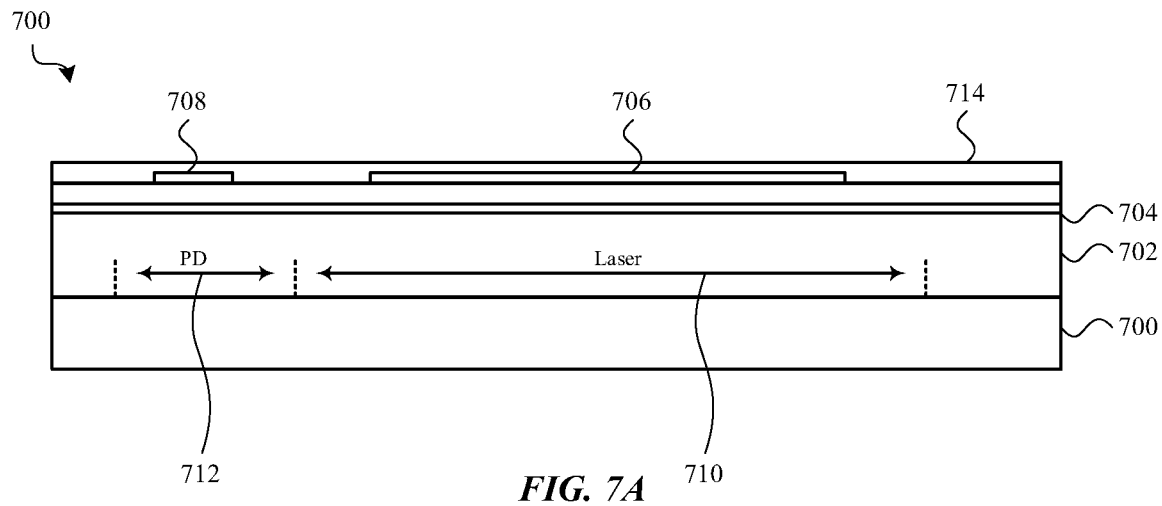
FIGS. 7A-7E illustrate one way to make the optoelectronic device described with reference to FIG. 4.

FIGS. 7A-7E illustrate one way to make the optoelectronic device described with reference to FIG. 4. As shown in FIG. 7A, a set of epitaxial layers 702 may be grown on a semiconductor substrate 700. The semiconductor substrate 700 (e.g., an InP substrate) may in some cases be an off-cut III-V semiconductor substrate. In addition, and in some cases, the set of epitaxial layers 702 may also be off-cut. For example, a set of InGaAs or InGaAsP epitaxial layers 702 may have an off-cut of 9.7°+/−5° from a (100) surface of an InP semiconductor substrate 700. A laser resonant cavity 704 (e.g., a quantum well or multiple quantum well (MQW) structure) may be formed within the set of epitaxial layers 702. Pads 706, 708 (e.g., pads including layers of titanium (Ti) and platinum (Pt)) may be deposited on the set of epitaxial layers 702 for the purpose of later depositing separate electrodes used to operate a laser 710 and a photodetector 712. The pads 706, 708 may be protected by a layer of silicon dioxide (SiO$_2$) 714 deposited on the set of epitaxial layers 702 and over the pads 706, 708.

Figure 7B:
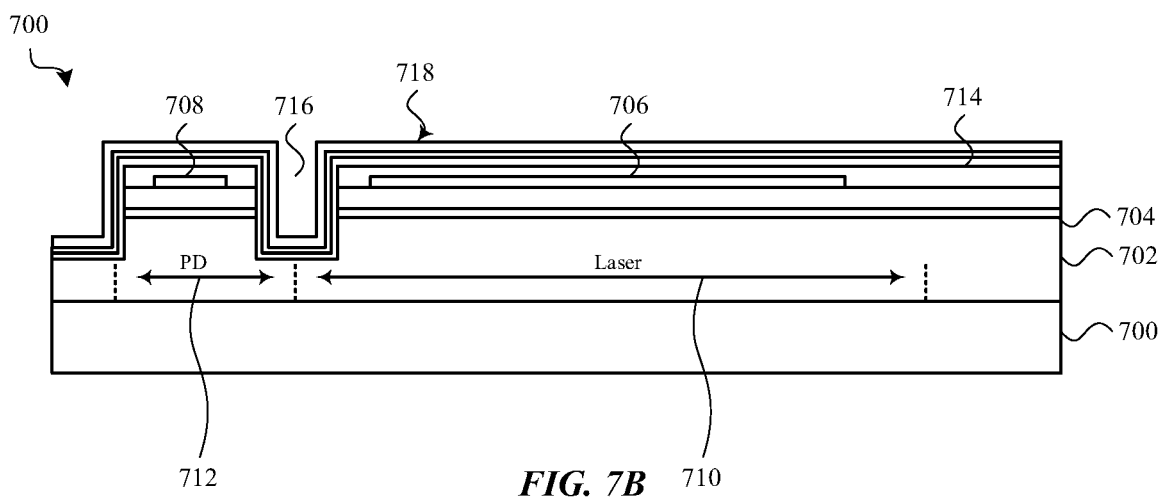

As shown in FIG. 7B, a trench 716 may be formed in the structure of FIG. 7A, to divide the set of epitaxial layers 702 into a laser portion and a photodetector portion. In some cases, the trench 716 may be etched (e.g., dry-etched). Alternatively, the set of epitaxial layers 702 may be removed in the location of the photodetector portion, and a new set of epitaxial layers may be grown for the photodetector portion and separated from the laser portion by a trench 716. A number of reflective coatings 718 (e.g., dielectric, metallic, semiconductor, and/or 2D/3D photonic coatings) may then be applied to the upper and vertical surfaces of the laser 710, photodetector 712, and trench 716 (as well as to the floor of the trench 716).

Figure 7C:
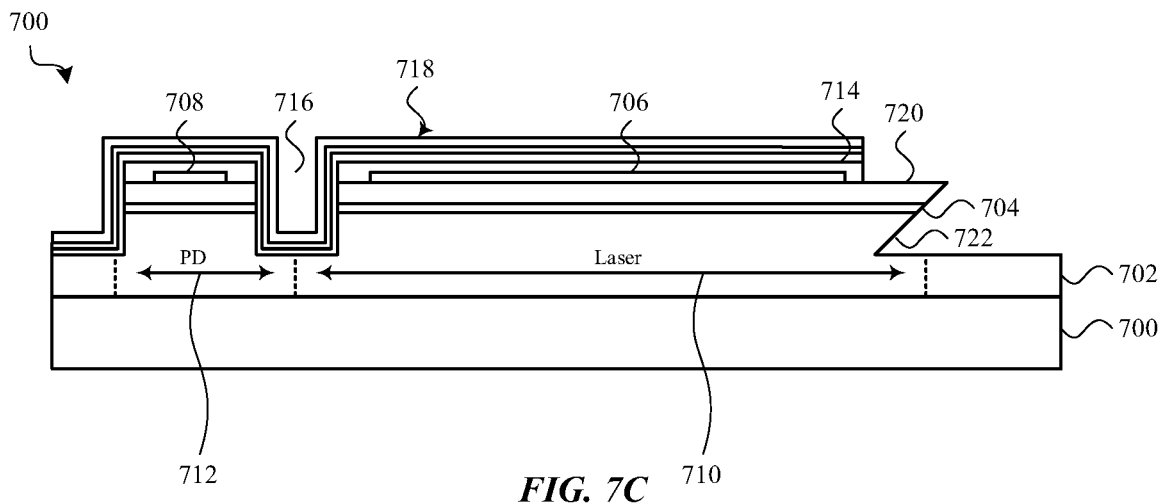

In FIG. 7C, the coatings 718 and silicon dioxide layer 714 may be etched (e.g., dry etched) to expose a surface 720 of the set of epitaxial layers 702, and the surface 720 may be wet-etched to form a surface 722 having a non-perpendicular angle (e.g., an angle of 45°+/−5°) with respect to the semiconductor substrate 700. The surface 722, in some cases in combination with coatings applied thereto, may function as a turning mirror.

Figure 7D:
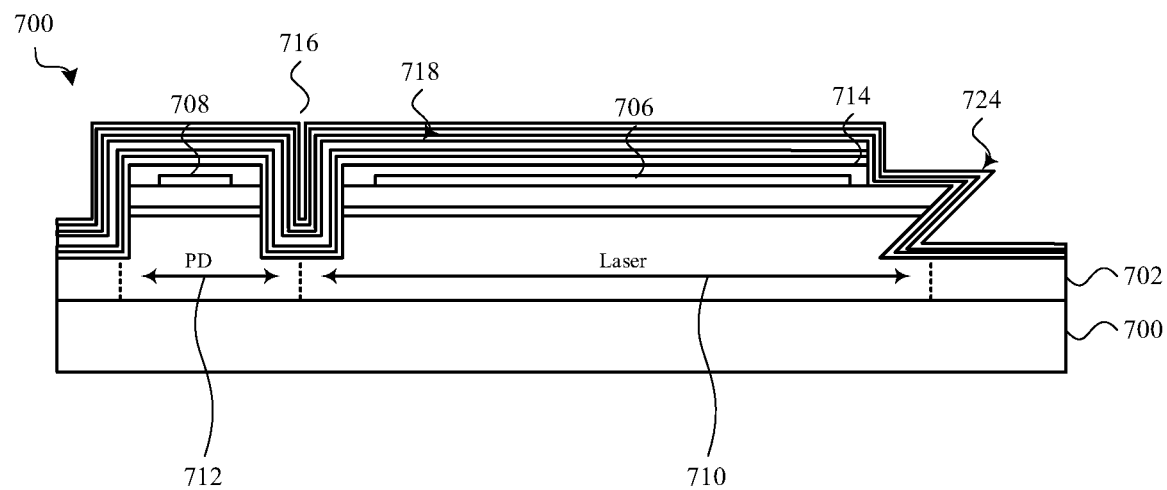

In FIG. 7D, additional coatings 724 may be applied to the upper and vertical surfaces of the laser 710, photodetector 712, and trench 716. In some cases, the coating(s) 718, or the combination of coatings 718 and 724, may be highly reflective to minimize optical loss (HR; e.g., the coating(s) 718 may have a reflectivity of approximately 85% or higher). The coating(s) 724 may be lowly reflective (LR; e.g., the coating(s) 724 may have a reflectivity of approximately 60% or less). The coating(s) 718 and/or 724 applied to the vertical surfaces of the trench 716, in combination with an air gap or fill within the trench 716, may form a dielectric-air-dielectric HR mirror.

Figure 7E:
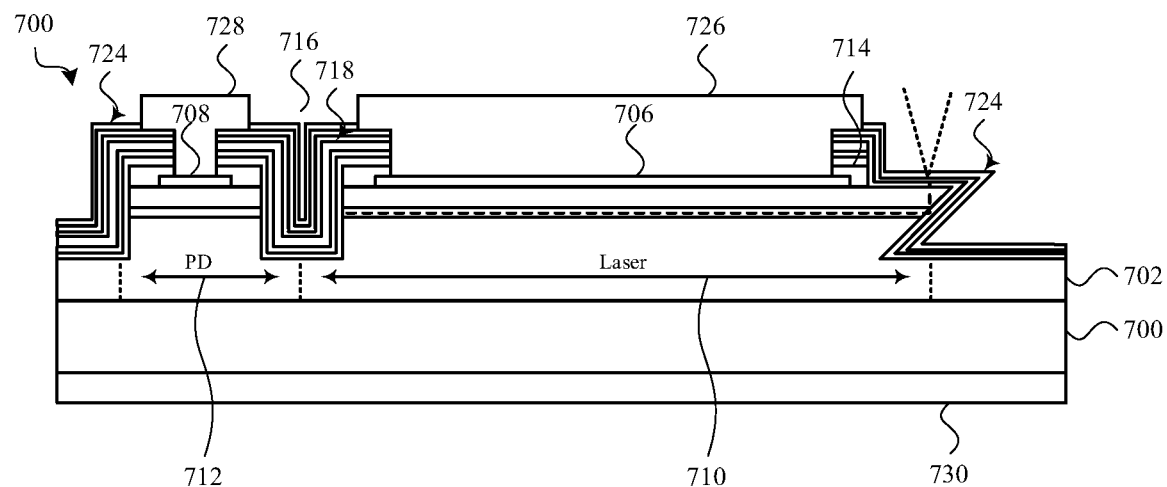

As shown in FIG. 7E, the coatings 718, 724 may be etched (e.g., dry etched) to expose the pads 706, 708, and conductive material may be deposited into and over the etched holes to form the upper electrodes 726, 728 (e.g., p-electrodes or p-pads) of the laser 710 and the photodetector 712 respectively. Conductive material may also be deposited on the bottom surface of the semiconductor substrate 700 to form a lower shared electrode 730 (e.g., an n-electrode or n-pad) of the laser 710 and photodetector 712. The electrodes 726 and 730 may be used to forward-bias the laser (a p-n diode) and inject current into the laser. When MQWs or other structures formed by the set of epitaxial layers 702 are electrically pumped, the laser may "lase" and emit a beam of light. The electrodes 728 and 730 may be used to reverse-bias the photodetector (another p-n diode), and may initiate the quantum-confined Stark effect (QCSE), which causes the MQWs or other structures formed by the set of epitaxial layers 702 to absorb light generated by the laser that passes through the coatings 718, 724 and air gap (or fill) and reaches the photodetector. For improved absorption of laser light by the photodetector, a more absorptive material may be regrown on the semiconductor substrate 700 to form the photodetector. In this case, the set of epitaxial layers 702 may be etched away in the photodetector region, and followed by a selective-area growth (SAG) to selectively grow a narrower bandgap material in the photodetector region. Since this regrown material is already absorptive (i.e., able to absorb and convert light into carriers) without the need of other effects such as the previously mentioned QCSE, the photodetector bias voltage can be extremely small (or in some cases the photodetector may not be biased). The regrown photodetector absorption layer can also be grown thick enough to match the diffracted laser beam spot size coming from the laser. For example, the photodetector absorption layer may be regrown with the same thickness as the entire set of optical confinement layers in the laser (i.e., the total thickness of the laser's MQWs plus any undoped/lightly p/n-doped spacers), or the photodetector absorption layer may be regrown thicker than the entire set of optical confinement layers in the laser. Here, "light doping" is defined as <5×10$^{17}$/cm$^3$. This may increase the in-coming light coupling into the photodetector and increase the photodetector's light-capturing efficiency. A re-grown photodetector approach may also allow the use of a much shorter photodetector for a given responsivity design target, hence more HCSEL-PD optoelectronic devices (dies) can be yielded on a wafer.

Figure 8:
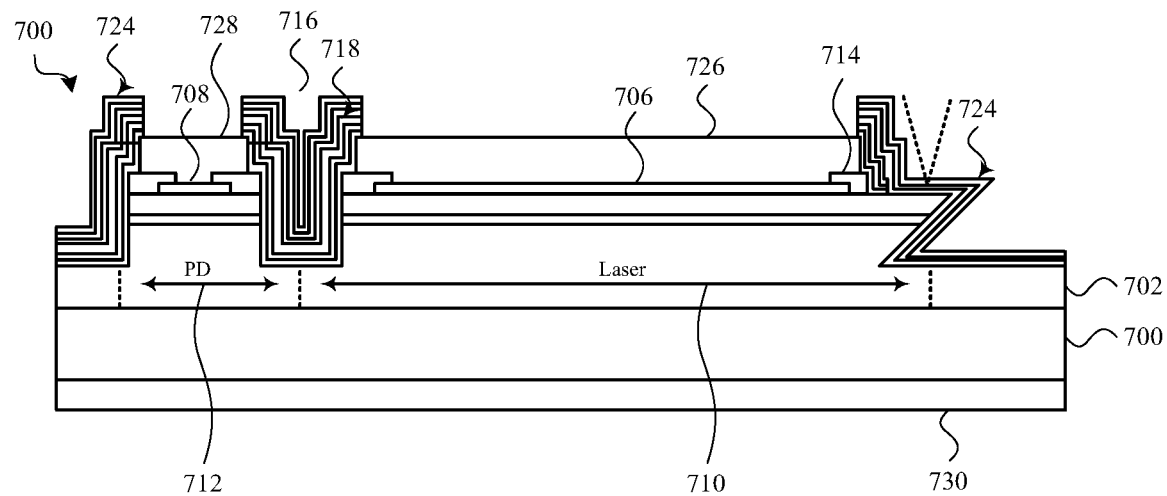
FIG. 8 illustrates another way to make the optoelectronic device described with reference to FIG. 4.

In FIGS. 7A-7E, the coatings 718, 724 are deposited before the conductive material of the upper electrodes 726, 728 is deposited. Alternatively, and as shown in FIG. 8, the silicon dioxide layer 714 may be etched after the process steps shown in FIG. 7A or after the trench 716 is formed in FIG. 7B, and the conductive material of the upper electrodes 726, 728 may be deposited before any of the coatings 718, 724 are applied.

Figure 9:
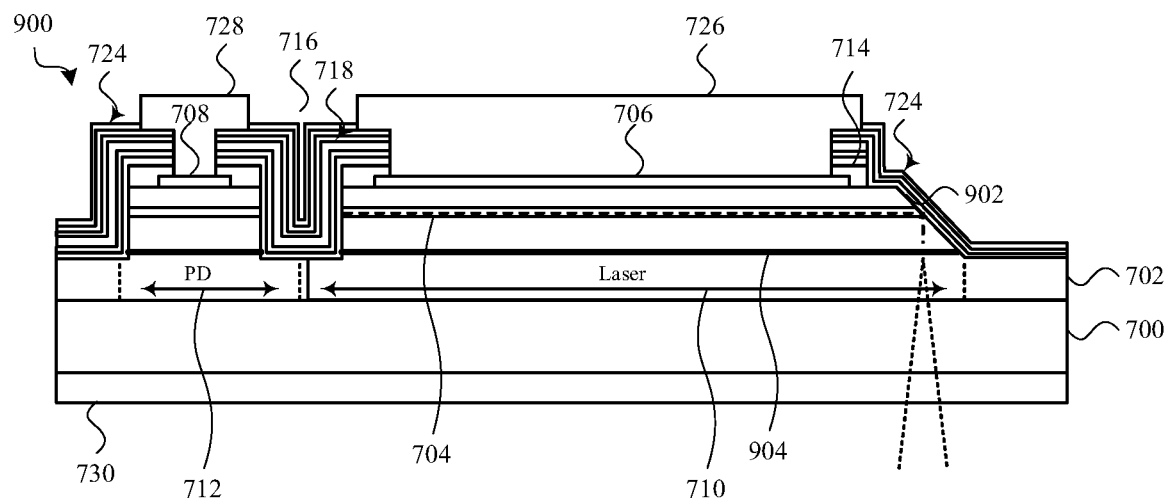
FIG. 9 shows another optoelectronic device that may be made using the process steps described with reference to FIG. 7A-7E or 8.

FIG. 9 shows another optoelectronic device 900 that may be made using the process steps described with reference to FIG. 7A-7E or 8. The optoelectronic device 900 differs from the optoelectronic devices described with reference to FIGS. 7A-7E and 8 in that the surface 902 defining the turning mirror is etched such that the turning mirror directs light through the device's semiconductor substrate 700. Also, a DBR layer 904 may be formed at the bottom of the set of epitaxial layers 702 to act as an LR mirror. As bent light travels downwards (vertically), there is no wave guiding the light, hence, the light starts to diffract and may diverge (i.e., form a wider beam) as it travels. Therefore, a DBR layer 904 very close to the laser's active layer (e.g., MQW layer, or laser resonant cavity) may be used to reflect light back to the horizontal portion of the laser resonant cavity 704. The DBR layer 904 structure and location inside the set of epitaxial layers 702 may be optimized to create the shortest possible vertical round-trip distance within the laser resonant cavity, to avoid undue expansion of the width of the light that is coupled back into the horizontal portion of the laser resonant cavity 704. Matching the reflected light spot size and the horizontal waveguide mode as closely matched as possible helps to minimize mode coupling loss.

In some embodiments, the above-mentioned HCSELs and optoelectronic devices can be made into distributed feedback (DFB) type devices using gratings inside the laser resonant cavities, to provide reflection feedback instead of relying on the coatings that form reflective structures (e.g., HR and LR mirrors) at the two ends of a laser resonant cavity. In these cases, there may not be an HR or LR mirror, but an anti-reflective (AR) coating may be needed on the surface of the semiconductor substrate or set of epitaxial layers where the primary emission occurs, to minimize reflection. For a bottom-emission (through-substrate emission) HCSEL, the DBR inside the epi stack can be eliminated, because an LR mirror is not needed.

Figure 10A:
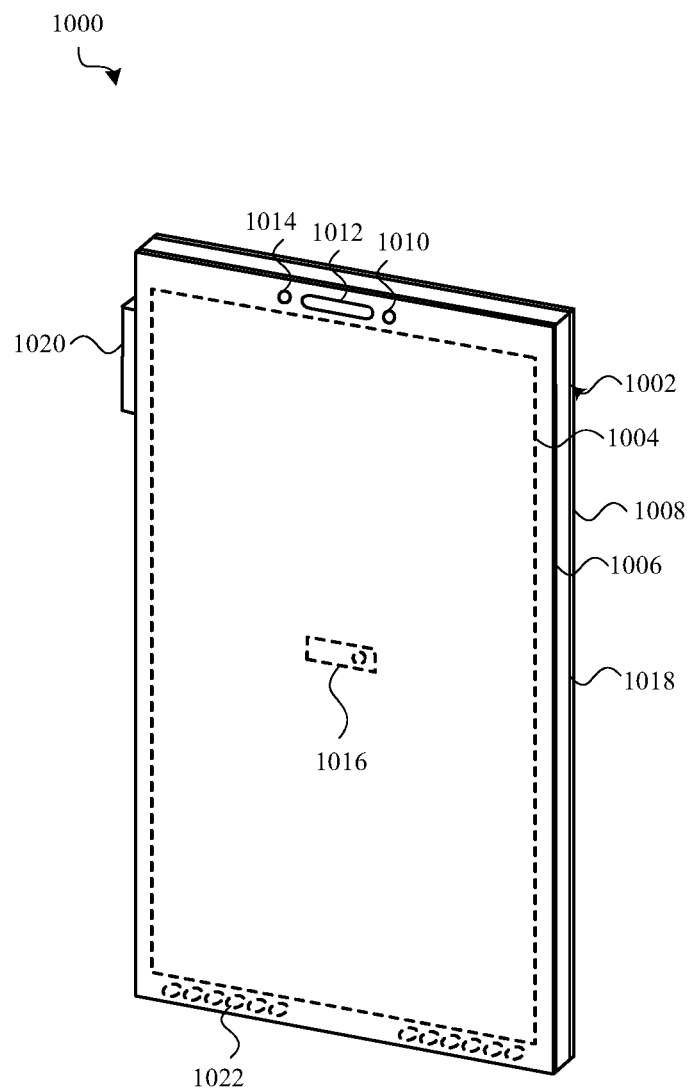
FIGS. 10A and 10B show a first example of a device that may include a particulate matter sensor.
Figure 10B:
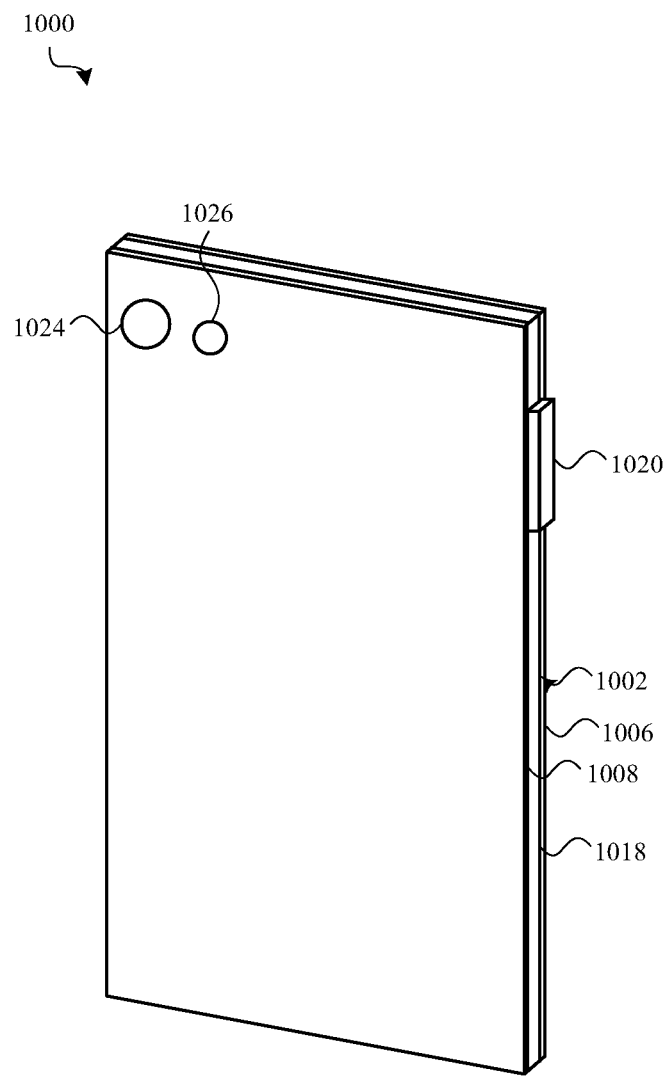

FIGS. 10A and 10B show a first example of a device 1000 that may include a HCSEL or optoelectronic device (e.g., a laser in combination with a photodetector) configured as described herein. The device's dimensions and form factor, including the ratio of the length of its long sides to the length of its short sides, suggest that the device 1000 is a mobile phone (e.g., a smartphone). However, the device's dimensions and form factor are arbitrarily chosen, and the device 1000 could alternatively be any portable electronic device including, for example a mobile phone, tablet computer, portable computer, portable music player, health monitor device, portable terminal, vehicle navigation system, robot navigation system, wearable device (e.g., a head-mounted display (HMD), glasses, watch, earphone or earbud, and so on), or other portable or mobile device. The device 1000 could also be a device that is semi-permanently located (or installed) at a single location. FIG. 10A shows a front isometric view of the device 1000, and FIG. 10B shows a rear isometric view of the device 1000. The device 1000 may include a housing 1002 that at least partially surrounds a display 1004. The housing 1002 may include or support a front cover 1006 or a rear cover 1008. The front cover 1006 may be positioned over the display 1004, and may provide a window through which the display 1004 may be viewed. In some embodiments, the display 1004 may be attached to (or abut) the housing 1002 and/or the front cover 1006. In alternative embodiments of the device 1000, the display 1004 may not be included and/or the housing 1002 may have an alternative configuration.

The display 1004 may include one or more light-emitting elements and may be configured, for example, as a light-emitting diode (LED) display, an organic LED (OLED), a liquid crystal display (LCD), an electroluminescent (EL) display, or other type of display. In some embodiments, the display 1004 may include, or be associated with, one or more touch and/or force sensors that are configured to detect a touch and/or a force applied to a surface of the front cover 1006.

The various components of the housing 1002 may be formed from the same or different materials. For example, the sidewall 1018 may be formed using one or more metals (e.g., stainless steel), polymers (e.g., plastics), ceramics, or composites (e.g., carbon fiber). In some cases, the sidewall 1018 may be a multi-segment sidewall including a set of antennas. The antennas may form structural components of the sidewall 1018. The antennas may be structurally coupled (to one another or to other components) and electrically isolated (from each other or from other components) by one or more non-conductive segments of the sidewall 1018. The front cover 1006 may be formed, for example, using one or more of glass, a crystal (e.g., sapphire), or a transparent polymer (e.g., plastic) that enables a user to view the display 1004 through the front cover 1006. In some cases, a portion of the front cover 1006 (e.g., a perimeter portion of the front cover 1006) may be coated with an opaque ink to obscure components included within the housing 1002. The rear cover 1008 may be formed using the same material(s) that are used to form the sidewall 1018 or the front cover 1006. In some cases, the rear cover 1008 may be part of a monolithic element that also forms the sidewall 1018 (or in cases where the sidewall 1018 is a multi-segment sidewall, those portions of the sidewall 1018 that are non-conductive). In still other embodiments, all of the exterior components of the housing 1002 may be formed from a transparent material, and components within the device 1000 may or may not be obscured by an opaque ink or opaque structure within the housing 1002.

The front cover 1006 may be mounted to the sidewall 1018 to cover an opening defined by the sidewall 1018 (i.e., an opening into an interior volume in which various electronic components of the device 1000, including the display 1004, may be positioned). The front cover 1006 may be mounted to the sidewall 1018 using fasteners, adhesives, seals, gaskets, or other components.

A display stack or device stack (hereafter referred to as a "stack") including the display 1004 may be attached (or abutted) to an interior surface of the front cover 1006 and extend into the interior volume of the device 1000. In some cases, the stack may include a touch sensor (e.g., a grid of capacitive, resistive, strain-based, ultrasonic, or other type of touch sensing elements), or other layers of optical, mechanical, electrical, or other types of components. In some cases, the touch sensor (or part of a touch sensor system) may be configured to detect a touch applied to an outer surface of the front cover 1006 (e.g., to a display surface of the device 1000).

In some cases, a force sensor (or part of a force sensor system) may be positioned within the interior volume below and/or to the side of the display 1004 (and in some cases within the device stack). The force sensor (or force sensor system) may be triggered in response to the touch sensor detecting one or more touches on the front cover 1006 (or a location or locations of one or more touches on the front cover 1006), and may determine an amount of force associated with each touch, or an amount of force associated with the collection of touches as a whole. Alternatively, the force sensor (or force sensor system) may trigger operation of the touch sensor (or touch sensory system in response to detecting a force on the front cover 1006. In some cases, the force sensor (or force sensor system) may be used to determine the locations of touches on the front cover 1006, and may thereby function as a touch sensor (or touch sensor system).

As shown primarily in FIG. 10A, the device 1000 may include various other components. For example, the front of the device 1000 may include one or more front-facing cameras 1010, speakers 1012, microphones, or other components 1014 (e.g., audio, imaging, and/or sensing components) that are configured to transmit or receive signals to/from the device 1000. In some cases, a front-facing camera 1010, alone or in combination with other sensors, may be configured to operate as a bio-authentication or facial recognition sensor. The device 1000 may also include various input and/or output devices 1016, which may be accessible from the front surface (or display surface) of the device 1000. In some cases, the front-facing camera 1010, I/O devices 1016, and/or other sensors of the device 1000 may be integrated with a display stack of the display 1004 and moved under the display 1004.

In some cases, one or more of the camera 1010, components 1014, and/or I/O devices 1016 may include one or an array of HCSELs or optoelectronic devices configured as described herein. The HCSELs of the optoelectronic devices may have laser resonant cavities that extend largely parallel to the output surface of the display 1004, but emit light through or adjacent the display 1004. Alternatively, a HCSEL of an optoelectronic device may have a laser resonant cavity that extends largely parallel to a button surface or housing surface, but emit light perpendicularly through the button or housing surface. Such HCSELs or other optoelectronic devices may be used for visible or invisible (e.g., infrared) illumination of a person (e.g., a face) or an object; as the transmitter portion of a proximity sensor; for sensing purposes (e.g., as self-mixing interference (SMI) sensors, line scanners, dot scanners, and so on); for measurement purposes (e.g., for time-of-flight measurements); as spatially or temporally shaped/modulated light sources for range finding, depth imaging, optical touch sensing, fingerprint sensing, or bio-authentication; and so on. In some cases, the HCSELs may emit infrared light (e.g., SWIR electromagnetic radiation) through the front cover 1006 or rear cover 1008.

The device 1000 may also include buttons or other input devices positioned along the sidewall 1018 and/or on a rear surface of the device 1000. For example, a volume button or multipurpose button 1020 may be positioned along the sidewall 1018, and in some cases may extend through an aperture in the sidewall 1018. The sidewall 1018 may include one or more ports 1022 that allow air, but not liquids, to flow into and out of the device 1000. In some embodiments, one or more sensors may be positioned in or near the port(s) 1022. For example, an ambient pressure sensor, ambient temperature sensor, internal/external differential pressure sensor, gas sensor, particulate matter sensor, or air quality sensor may be positioned in or near a port 1022.

In some embodiments, the rear surface of the device 1000 may include a rear-facing camera 1024 or other optical sensor (see FIG. 10B). A flash or light source 1026 may also be positioned along the rear of the device 1000 (e.g., near the rear-facing camera). In some cases, the rear surface of the device 1000 may include multiple rear-facing cameras. In some cases, the camera 1024, light source 1026, and/or other optical sensors may include one or an array of HCSELs or optoelectronic devices configured as described herein.

The camera(s), microphone(s), pressure sensor(s), temperature sensor(s), biometric sensor(s), button(s), proximity sensor(s), touch sensor(s), force sensor(s), particulate matter or air quality sensor(s), and so on of the device 1900 may form parts of various sensor systems.

Figure 11A:
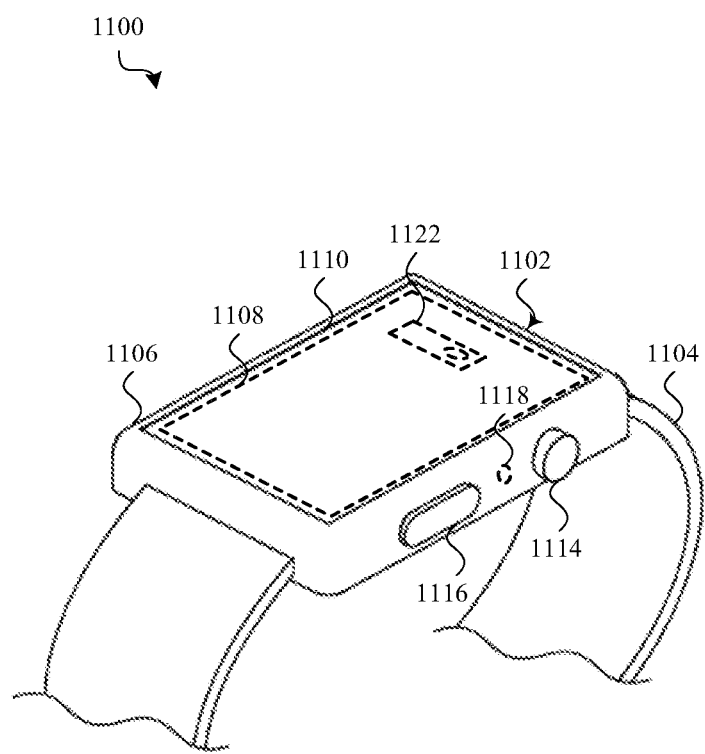
FIGS. 11A and 11B show a second example of a device that may include a particulate matter sensor.
Figure 11B:
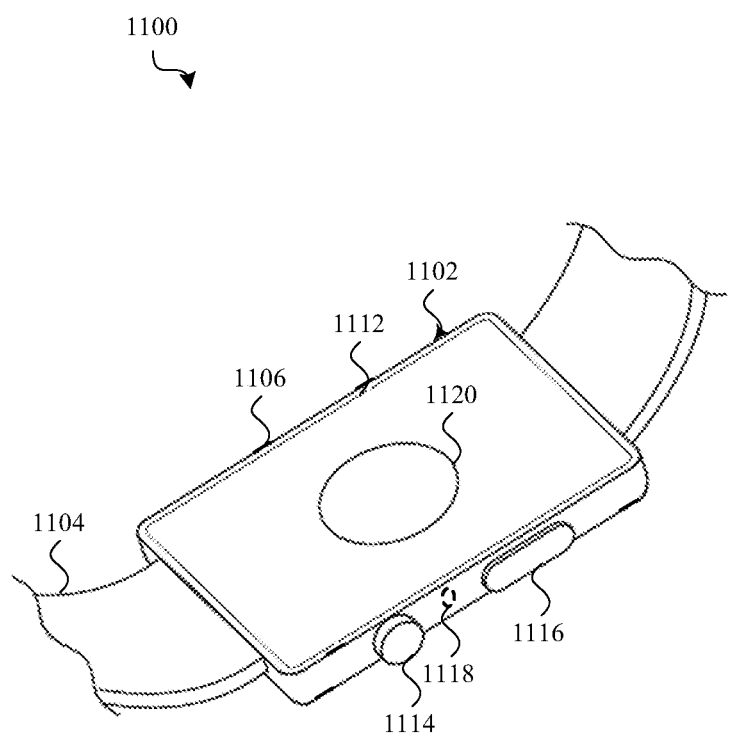

FIGS. 11A and 11B show a second example of a device 1100 that may include a HCSEL or optoelectronic device (e.g., a laser in combination with a photodetector) configured as described herein. The device's dimensions and form factor, and inclusion of a band 1104, suggest that the device 1100 is an electronic watch. However, the device 1100 could alternatively be any wearable electronic device. FIG. 11A shows a front isometric view of the device 1100, and FIG. 11B shows a rear isometric view of the device 1100. The device 1100 may include a body 1102 (e.g., a watch body) and a band 1104. The watch body 1102 may include an input or selection device, such as a crown 1114 or a button 1116. The band 1104 may be used to attach the body 1102 to a body part (e.g., an arm, wrist, leg, ankle, or waist) of a user. The body 1102 may include a housing 1106 that at least partially surrounds a display 1108. The housing 1106 may include or support a front cover 1110 (FIG. 11A) or a rear cover 1112 (FIG. 11B). The front cover 1110 may be positioned over the display 1108, and may provide a window through which the display 1108 may be viewed. In some embodiments, the display 1108 may be attached to (or abut) the housing 1106 and/or the front cover 1110. In alternative embodiments of the device 1100, the display 1108 may not be included and/or the housing 1106 may have an alternative configuration.

The housing 1106 may in some cases be similar to the housing described with reference to FIGS. 10A and 10B, and the display 1108 may in some cases be similar to the display described with reference to FIGS. 10A-10B.

The device 1100 may include various sensor systems, and in some embodiments may include some or all of the sensor systems included in the device described with reference to FIGS. 10A-10B. In some embodiments, the device 1100 may have a port 1118 (or set of ports) on a side of the housing 1106 (or elsewhere), and an ambient pressure sensor, ambient temperature sensor, internal/external differential pressure sensor, gas sensor, particulate matter sensor, or air quality sensor may be positioned in or near the port(s) 1118.

In some cases, the rear surface (or skin-facing surface) of the device 1100 may include a flat or raised area 1120 that includes one or more skin-facing sensors. For example, the area 1120 may include a heart-rate monitor, a respiration-rate monitor, or a blood pressure monitor. The area 1120 may also include an off-wrist detector or other sensor.

In some cases, one or more cameras, sensors, light sources, or I/O devices 1122 of the device 1100 (or in its band 1104 or band attachment mechanism) may include one or an array of HCSELs or optoelectronic devices configured as described herein. The HCSELs of the optoelectronic devices may have laser resonant cavities that extend largely parallel to the front cover 1110 (or output surface of the display 1108), the rear cover 1112, a surface of the crown 1114, or a surface of the button 1116, so that the HSCELs emit light through the display 1108, rear cover 1112, crown 1114, or button 1116. Such HCSELs or other optoelectronic devices may be used for visible or invisible (e.g., infrared) illumination of a person (e.g., a face) or an object; for sensing purposes (e.g., as self-mixing interference (SMI) sensors, line scanners, dot scanners, and so on); for measurement purposes (e.g., for time-of-flight measurements); and so on. In some cases, the HCSELs may emit infrared light (e.g., SWIR electromagnetic radiation) through the front cover 1110, rear cover 1112, crown 1114, or button 1116.

Figure 12:
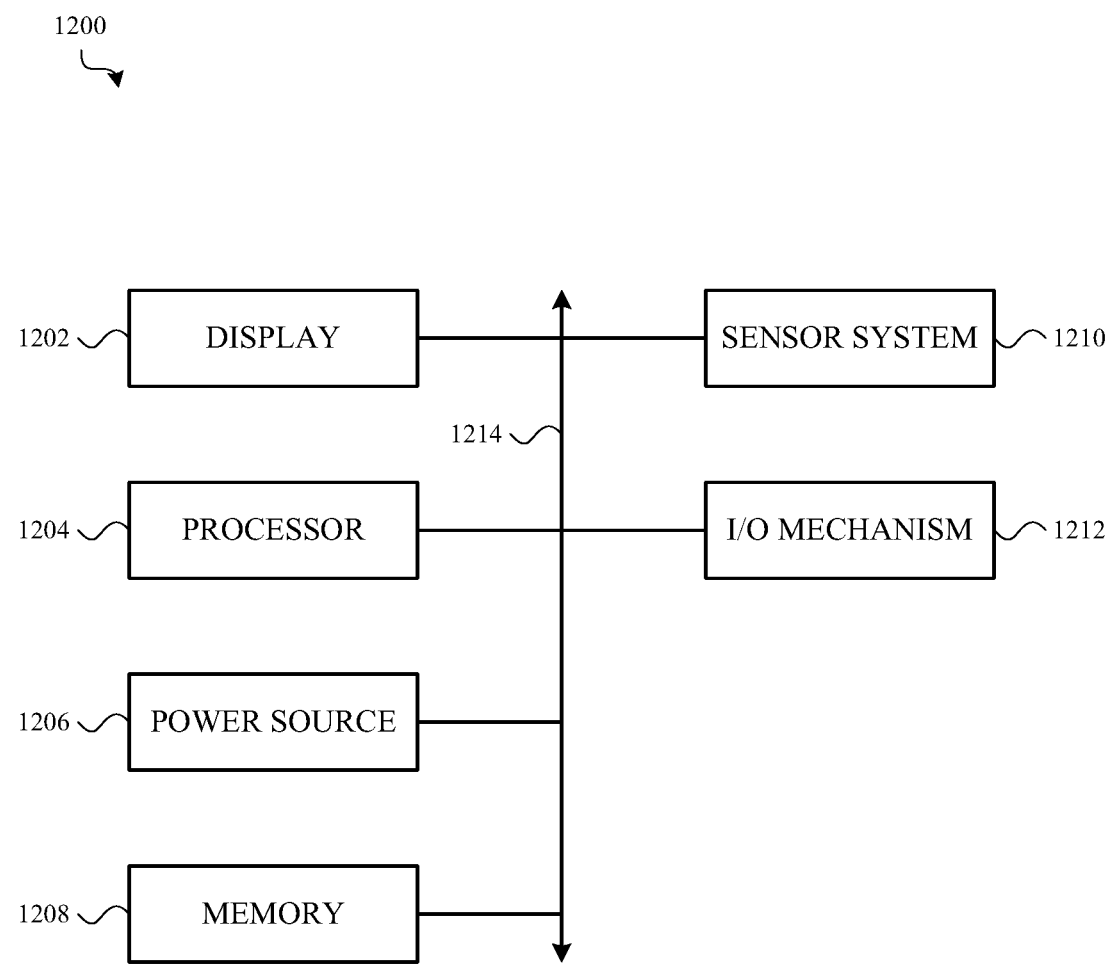
FIG. 12 shows an example electrical block diagram of an electronic device.

FIG. 12 shows a sample electrical block diagram of an electronic device 1200, which electronic device may in some cases take the form of the device described with reference to FIGS. 10A-10B or FIGS. 11A-11B and/or include the HCSEL or optoelectronic device described with reference to any of FIGS. 1-9. The electronic device 1200 may include a display 1202 (e.g., a light-emitting display), a processor 1204, a power source 1206, a memory 1208 or storage device, a sensor system 1210, or an input/output (I/O) mechanism 1212 (e.g., an input/output device, input/output port, or haptic input/output interface). The processor 1204 may control some or all of the operations of the electronic device 1200. The processor 1204 may communicate, either directly or indirectly, with some or all of the other components of the electronic device 1200. For example, a system bus or other communication mechanism 1214 can provide communication between the display 1202, the processor 1204, the power source 1206, the memory 1208, the sensor system 1210, and the I/O mechanism 1212.

The processor 1204 may be implemented as any electronic device capable of processing, receiving, or transmitting data or instructions, whether such data or instructions is in the form of software or firmware or otherwise encoded. For example, the processor 1204 may include a microprocessor, a central processing unit (CPU), an application-specific integrated circuit (ASIC), a digital signal processor (DSP), a controller, or a combination of such devices. As described herein, the term "processor" is meant to encompass a single processor or processing unit, multiple processors, multiple processing units, or other suitably configured computing element or elements.

It should be noted that the components of the electronic device 1200 can be controlled by multiple processors. For example, select components of the electronic device 1200 (e.g., the sensor system 1210) may be controlled by a first processor and other components of the electronic device 1200 (e.g., the display 1202) may be controlled by a second processor, where the first and second processors may or may not be in communication with each other.

The power source 1206 can be implemented with any device capable of providing energy to the electronic device 1200. For example, the power source 1206 may include one or more batteries or rechargeable batteries. Additionally or alternatively, the power source 1206 may include a power connector or power cord that connects the electronic device 1200 to another power source, such as a wall outlet.

The memory 1208 may store electronic data that can be used by the electronic device 1200. For example, the memory 1208 may store electrical data or content such as, for example, audio and video files, documents and applications, device settings and user preferences, timing signals, control signals, and data structures or databases. The memory 1208 may include any type of memory. By way of example only, the memory 1208 may include random access memory, read-only memory, Flash memory, removable memory, other types of storage elements, or combinations of such memory types.

The electronic device 1200 may also include one or more sensor systems 1210 positioned almost anywhere on the electronic device 1200. In some cases, sensor systems 1210 may be positioned as described with reference to FIGS. 10A-10B or FIGS. 11A-11B. The sensor system(s) 1210 may be configured to sense one or more type of parameters, such as but not limited to, light; touch; force; heat; movement; relative motion; biometric data (e.g., biological parameters) of a user; particulate matter concentration, air quality; proximity; position; connectedness; and so on. By way of example, the sensor system(s) 1210 may include a heat sensor, a position sensor, a light or optical sensor, an accelerometer, a pressure transducer, a gyroscope, a magnetometer, a health monitoring sensor, a particulate matter sensor, an air quality sensor, and so on. Additionally, the one or more sensor systems 1210 may utilize any suitable sensing technology, including, but not limited to, magnetic, capacitive, ultrasonic, resistive, optical, acoustic, piezoelectric, or thermal technologies.

The I/O mechanism 1212 may transmit or receive data from a user or another electronic device. The I/O mechanism 1212 may include the display 1202, a touch sensing input surface, a crown, one or more buttons (e.g., a graphical user interface "home" button), one or more cameras (including an under-display camera), one or more microphones or speakers, one or more ports such as a microphone port, and/or a keyboard. Additionally or alternatively, the I/O mechanism 1212 may transmit electronic signals via a communications interface, such as a wireless, wired, and/or optical communications interface. Examples of wireless and wired communications interfaces include, but are not limited to, cellular and Wi-Fi communications interfaces.

The foregoing description, for purposes of explanation, uses specific nomenclature to provide a thorough understanding of the described embodiments. However, it will be apparent to one skilled in the art, after reading this description, that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art, after reading this description, that many modifications and variations are possible in view of the above teachings.

As described above, one aspect of the present technology may be the gathering and use of data available from various sources, including biometric data (e.g., face or fingerprint data). The present disclosure contemplates that, in some instances, this gathered data may include personal information data that uniquely identifies or can be used to identify, locate, or contact a specific person. Such personal information data can include, for example, biometric data (e.g., fingerprint data) and data linked thereto (e.g., demographic data, location-based data, telephone numbers, email addresses, home addresses, data or records relating to a user's health or level of fitness (e.g., vital signs measurements, medication information, exercise information), date of birth, or any other identifying or personal information).

The present disclosure recognizes that the use of such personal information data, in the present technology, can be used to the benefit of users. For example, the personal information data can be used to authenticate a user to access their device, or gather performance metrics for the user's interaction with an augmented or virtual world. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the US, collection of or access to certain health data may be governed by federal and/or state laws, such as the Health Insurance Portability and Accountability Act (HIPAA); whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, in the case of advertisement delivery services, the present technology can be configured to allow users to select to "opt in" or "opt out" of participation in the collection of personal information data during registration for services or anytime thereafter. In another example, users can select not to provide data to targeted content delivery services. In yet another example, users can select to limit the length of time data is maintained or entirely prohibit the development of a baseline profile for the user. In addition to providing "opt in" and "opt out" options, the present disclosure contemplates providing notifications relating to the access or use of personal information. For instance, a user may be notified upon downloading an app that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data at a city level rather than at an address level), controlling how data is stored (e.g., aggregating data across users), and/or other methods.

Therefore, although the present disclosure broadly covers use of personal information data to implement one or more various disclosed embodiments, the present disclosure also contemplates that the various embodiments can also be implemented without the need for accessing such personal information data. That is, the various embodiments of the present technology are not rendered inoperable due to the lack of all or a portion of such personal information data. For example, content can be selected and delivered to users by inferring preferences based on non-personal information data or a bare minimum amount of personal information, such as the content being requested by the device associated with a user, other non-personal information available to the content delivery services, or publicly available information.

What is claimed is:

1. An optoelectronic device, comprising:
    an off-cut III-V semiconductor substrate;
    a set of epitaxial layers formed on the off-cut III-V semiconductor substrate;
    a horizontal cavity surface-emitting laser (HCSEL) having a laser resonant cavity formed in the set of epitaxial layers;
    a first reflective structure oriented perpendicular to the off-cut III-V semiconductor substrate and bounding a first end of a horizontal portion of the laser resonant cavity; and
    a second reflective structure oriented parallel to the off-cut III-V semiconductor substrate and bounding a first end of a vertical portion of the laser resonant cavity; wherein,
    the first reflective structure has a first reflectivity different from a second reflectivity of the second reflective structure;
    a first coating layer applied to the set of epitaxial layers is included in the first reflective structure and the second reflective structure; and
    a second coating layer applied to the set of epitaxial layers is included in the first reflective structure and is absent in the second reflective structure.

2. The optoelectronic device of claim 1, wherein the set of epitaxial layers has an off-cut of 9.7°+/−5° from a (100) surface of the semiconductor substrate.

3. The optoelectronic device of claim 1, wherein the set of epitaxial layers defines a reflective structure angled at 45°+/−5° from a surface of the semiconductor substrate.

4. The optoelectronic device of claim 1, further comprising:
    a photodetector formed in the set of epitaxial layers and separated from the HCSEL by a single trench having a first vertical wall abutting the HCSEL and a second vertical wall abutting the photodetector.

5. The optoelectronic device of claim 1, further comprising:
    a third reflective structure defining a transition between the horizontal portion of the laser resonant cavity and the vertical portion of the laser resonant cavity; wherein,
    the third reflective structure has a third reflectivity different from the first reflectivity of the first reflective structure.

6. The optoelectronic device of claim 5, wherein:
    the second reflective structure is buried in the set of epitaxial layers; and
    the HCSEL is configured to make a primary light emission through the second reflective structure and through the semiconductor substrate.

7. The optoelectronic device of claim 1, wherein:
    the set of epitaxial layers defines a reflective structure forming a non- perpendicular angle with the semiconductor substrate; and
    the reflective structure has a surface roughness less than 100 nanometers (nm).

8. An optoelectronic device, comprising:
    a semiconductor substrate;
    a laser, epitaxially grown on the semiconductor substrate and having a laser resonant cavity extending between a front side output surface parallel to the semiconductor substrate and a back side output surface perpendicular to the semiconductor substrate;
    a semiconductor device, epitaxially grown on the semiconductor substrate and separated from the back side output surface of the laser by a single trench having a first vertical wall abutting the laser and a second vertical wall abutting the semiconductor device; and
    at least two coatings comprising a first coating and a second coating, each of the first coating and the second coating on at least one of the first vertical wall or the second vertical wall, and only one of the first coating or the second coating extending over the front side output surface of the laser; wherein,
    the laser resonant cavity has a horizontal portion parallel to the semiconductor substrate;
    each of the first vertical wall and the second vertical wall is oriented perpendicular to the semiconductor substrate; and
    the first coating has a first reflectivity different from a second reflectivity of the second coating.

9. The optoelectronic device of claim 8, wherein:
    the laser is a horizontal cavity surface-emitting laser (HCSEL);
    the laser resonant cavity is an L-shaped laser resonant cavity including the horizontal portion and a vertical portion.

10. The optoelectronic device of claim 8, wherein the at least two coatings are symmetrically applied to the first vertical wall and the second vertical wall.

11. The optoelectronic device of claim 8, wherein the at least two coatings are asymmetrically applied to the first vertical wall and the second vertical wall.

12. The optoelectronic device of claim 8, wherein the at least two coatings are applied to only one of the first vertical wall or the second vertical wall.

13. The optoelectronic device of claim 8, wherein:
the semiconductor device comprises a photodetector; and
the at least two coatings at least partly define a reflective structure bounding one end of the horizontal portion of the laser resonant cavity; wherein,
the reflective structure reflects a first portion of light propagating along the horizontal portion of the laser resonant cavity and allows a second portion of the light to pass and propagate toward the photodetector.

14. The optoelectronic device of claim 8, wherein a coating of the at least two coatings bounds an air gap within the trench.

15. The optoelectronic device of claim 8, wherein a coating of the at least two coatings bounds a fill material within the trench.

16. The optoelectronic device of claim 8, wherein the at least two coatings comprise:
at least one pair of coatings defining a low-high-index quarter-wavelength distributed Bragg reflector (DBR) pair or having a thickness equal to a quarter-wavelength plus an integer multiple of half-wavelengths; and
a coating defining a half-wavelength low-index layer or having a thickness that is an integer multiple of a half-wavelength.

17. The optoelectronic device of claim 8, wherein the laser and the semiconductor device include a same set of epitaxial layers.

18. The optoelectronic device of claim 8, wherein the laser and the semiconductor device include different sets of epitaxial layers.

19. An electronic device, comprising:
a housing;
a cover mounted to the housing;
a display positioned under the cover and viewable through the cover;
a horizontal cavity surface-emitting laser (HCSEL) configured to emit infrared radiation through at least a primary emission facet at one end of the HCSEL and through the display and the cover;
a semiconductor substrate on which the HCSEL is epitaxially grown;
a photodetector, epitaxially grown on the semiconductor substrate and separated from the HCSEL by a trench;
at least one first coating on at least one vertical wall of the trench and not extending over the primary emission facet; and
at least one second coating on at least one vertical wall of the trench and extending over the primary emission facet; wherein,
the at least one first coating has a first reflectivity different from a second reflectivity of the at least one second coating.

20. The electronic device of claim 19, further comprising:
an off-cut III-V semiconductor substrate;
a set of epitaxial layers in which the HCSEL is formed on the off-cut III-V semiconductor substrate.

21. The electronic device of claim 19, wherein the display positioned under the cover comprises a touch-sensing display.

* * * * *